United States Patent [19]

Anderson

[11] Patent Number: 4,836,651
[45] Date of Patent: Jun. 6, 1989

[54] FLEXIBLE CIRCUIT INTERCONNECTION FOR A MATRIX ADDRESSED LIQUID CRYSTAL PANEL

[75] Inventor: Richard A. Anderson, Belmont, Mass.

[73] Assignee: General Electrical Co., Wilmington, Mass.

[21] Appl. No.: 128,651

[22] Filed: Dec. 3, 1987

[51] Int. Cl.$^4$ .................................. G02F 1/13
[52] U.S. Cl. .................... 350/334; 350/333; 350/336
[58] Field of Search ............... 350/332, 333, 334, 336

[56] References Cited

U.S. PATENT DOCUMENTS

| | | | |
|---|---|---|---|
| 4,474,432 | 10/1984 | Takamatsu et al. | 350/332 X |
| 4,514,042 | 4/1985 | Nukii et al. | 350/334 X |
| 4,549,174 | 10/1985 | Funada et al. | 350/336 X |
| 4,688,896 | 8/1987 | Castleberry | 350/333 |

FOREIGN PATENT DOCUMENTS 59-60420  4/1984  Japan .................................. 350/334

OTHER PUBLICATIONS

"French Lab Produces Tiny LCD Unit for Videophone Use", *Electronics,* vol. 50, No. 26 (Dec. 1977), pp. 3E-4E.

Primary Examiner—John S. Heyman
Assistant Examiner—Richard Gallivan
Attorney, Agent, or Firm—I. D. Blumenfeld

[57] ABSTRACT

Leadless chip carriers supporting the row and column driver circuitry for a Liquid Crystal Display are secured directly to a mulitlayer, flexible connector. The flexible connector is attached to the conductive pads on the edge of a Liquid Crystal Display Panel and is bent perpendicularly to the plane of the Display to provide a space efficient, modular, hermetically sealed packaging arrangement.

6 Claims, 3 Drawing Sheets

U.S. Patent   Jun. 6, 1989   Sheet 2 of 3   4,836,651
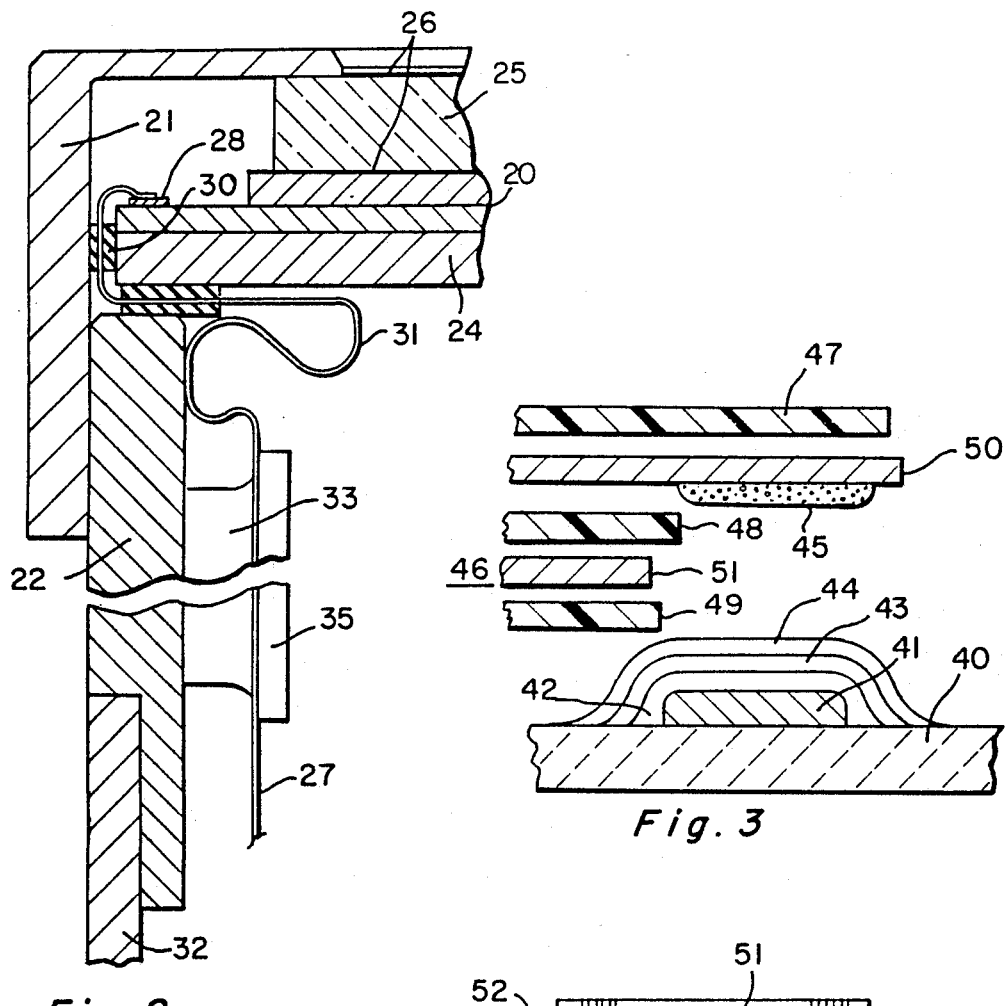
Fig. 2
Fig. 3
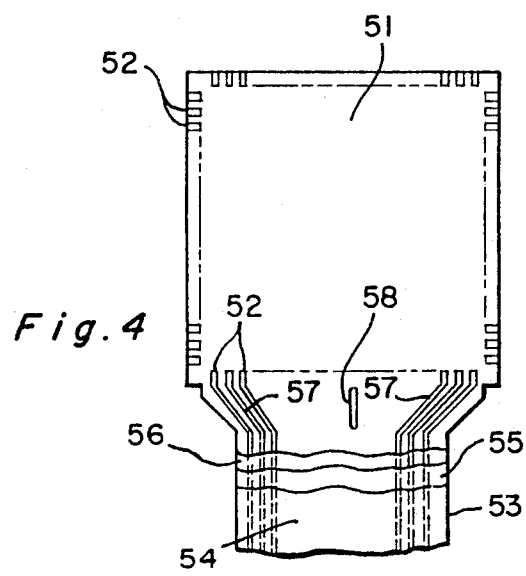
Fig. 4

FLEXIBLE CIRCUIT INTERCONNECTION FOR A MATRIX ADDRESSED LIQUID CRYSTAL PANEL

BACKGROUND OF THE INVENTION

This invention relates to a Liquid Crystal Display of the X-Y matrix type in which multi-layer, flexible interconnection circuits support the driver electronics for the display. More particularly, it relates to a space efficient packaging scheme in which the flexible interconnect circuitry is bent away from the plane of the display to minimize size.

Liquid crystal display devices of the X-Y matrix type are by now well-known and reference is hereby made to U.S. Pat. No. 4,688,896 issued Aug. 25, 1987, assigned to the General Electric Company, the assignee of the present invention, for a showing of a typical X-Y matrix type display. In the X-Y matrix display the row and column address lines are interdigitated (one half extending to one edge of the display and the other half to the opposite edge) so that the row and column address lines can be driven from all four edges of the display. Hitherto in packaging matrix addressed Liquid Crystal Displays it has been customary to mount the row and column driver electronics on rigid printed circuit boards and to connect the driver electronics to the connector pads on the Liquid Crystal glass by means of flexible interconnect elements. Such prior art systems however have a number of shortcomings because the use of printed circuit boards results in inefficient space utilization. This is particularly so with high density displays because mounting of the driver electronics on a separate circuit board and using a flexible connector between the electronics on the circuit board and the display results in adding large border areas to the display increasing the overall size.

It is therefore desirable to mount the driver electronics directly on the flexible connector (flex) which may then be bent to optimize space utilization. That is, the row and column driver chips may be secured in hermetically sealed, leadless, ceramic chip carriers which are mounted directly on the flexible multi-layer connector.

It is therefore a principal objective of the instant invention to provide a packaging system for an X-Y addressed Liquid Crystal Display which utilizes flexible interconnect circuitry to support the X-Y row and column driver circuitry.

Another objective of the invention is to provide a packaging technique for a high density Liquid Crystal Display of the X-Y matrix type using flexible interconnect circuitry to minimize space.

Still another objective of the invention is to provide a matrix addressed Liquid Crystal Display with flexible interconnects which support the display driver electronics.

Still other objectives and advantages of the invention will be realized as the description thereof proceeds.

While the specification includes the claims defining the features of the invention which are regarded as being novel, it is believed that the invention, together with further objectives thereof, will best be understood with the following description taken in conjunction with the drawings in which:

BRIEF DESCRIPTION OF THE DRAWINGS

FIG. 2 is a sectional view of a portion of the liquid crystal display, including the housing, showing the manner in which the flexible connector is positioned in the housing.

FIG. 3 is an exploded view of the multi-layer flex circuitry and the display glass showing the manner in which flex circuitry is soldered to the connector pads on the display;

FIG. 4 is a plan view of the underside of a leadless ceramic chip carrier showing the manner in which a chip carrier is connected to the flex circuitry;

DETAILED DESCRIPTION OF THE PREFERRED EMBODIMENT

Figure 1:
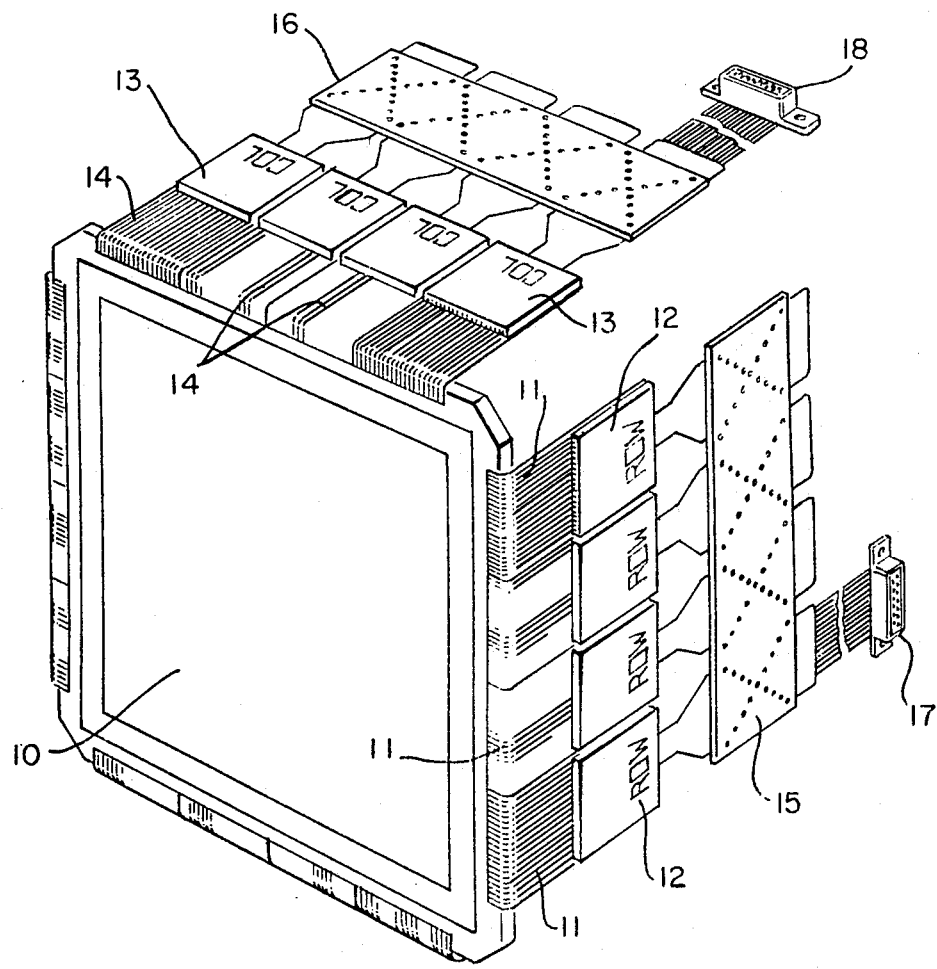
FIG. 1 is a perspective view of a Flat Liquid Crystal Display Panel (without the associated housing) showing the flexible interconnect circuits with the driver electronics mounted thereon.

FIG. 1 is a perspective view of a Liquid Crystal Display (LCD) and of the multi-layer flex circuitry supporting the driver chips. For simplicity of illustration the housing, bezels, etc. in which the display element, the lighting and the associated interconnect and electronic circuitry are mounted are not shown in FIG. 1.

The Flat Panel Liquid Crystal Display element is illustrated generally at 10 and typically consists of a pair of glass substrates sealed around the edges to define a cavity in which a liquid crystal solution is retained. The interior surface of one of the substrates contains a transparent, conductive ground plane preferably of indium tin oxide(ITO). Deposited on the interior surface of the other glass substrate is a pattern of individual transparent electrodes not shown which form an X-Y matrix of the individual Liquid Crystal Cells. The Cells form the picture elements or pixels. The individual pixels are separated by the X and Y address lines to form a row and column arrangement with the address lines preferably being interdigitated, (as shown in the above identified U.S. patent) so that the Y and X address lines may be driven from opposite edges of the display.

Shown at the right hand and top edges of display 10 are a plurality of multi-layer flex circuits 11 and 14 which support row drivers 12 and column drivers 13, respectively. Row drivers 12, and column drivers 13 supported on the multilayer flex circuits are hermetically sealed in leadless chip carriers 15 which contain the driver chips, not shown. The driver chips are connected to the multi-layer flex conductors through the connector pads found on the side and underside of the chip carriers (as may be seen most clearly in FIG. 4.)

One end of each of the multi-layer flex circuits 11 and 14 is connected to the individual address line connector pads extending to the edge of the Display substrate. After the flex connectors are soldered to these address line connector pads, the flex connectors are, as shown, bent out of the plane (preferably at right angles) of the Liquid Crystal Display Panel thereby minimizing both the edge surface of the display panel and overall surface of the display assembly. In FIG. 1, the top and right hand sides are shown as having four flex connectors each carrying a leadless chip carrier. For example, with a 4×4 Liquid Crystal Display having a line density of 100 lines per inch, each edge of the display has 200 connector pads and 200 address lines each driven from each edge. Thus, each of the flex circuits drives 50 address lines.

Flex circuits 11 and 14 are connected respectively to cascade flexes 15 and 16 and thence to multi-pin connectors 17 and 18 for energizing the driver circuits.

FIG. 2 shows a sectional view of a portion of an entire assembly including the housing bezels, etc/. and shows the manner in which the flex circuitry is disposed inside of the housing. A flat panel display 20 is supported inside of a bezel 21 and a case or housing 22 which is affixed to the bezel 21 by means of a metallic, heat spreader 23. Liquid Crystal panel 20 is supported between polarizers 24 and 25 with polarizer 24 also including a diffusing element not shown. An anti-reflecting coating 26 is deposited on the upper surface of polarizer 25.

Conductive tracks of flex connector 27 are soldered to connector pad 28 on surfaces of Liquid Crystal Flat Panel 20. Beyond the point of attachment to the Display connector pad 28 the flex is bent perpendicularly to the plane of the display and is supported between a first flex tear guard 30 located between the edge polarizer of 24 and bezel 21.

Flex circuit 27 is supported by a second tear guard 30 and is bent to form a flex service loop 31. Thereafter Flex 27 extends parallel to housing 22. Chip carrier 33 supported on flex 27 is positioned and secured against heat spreader 23 to dissipate heat from the chip carrier. It can be readily appreciated from FIG. 2 that the spacing between the flex element and the wall may be very small the minimal spacing being the heighth of the flex chip carrier thereby reducing the overall size of the display assembly, and improving the thermal performance of the driver chip.

A light source, not shown, is positioned in space 34 behind polarizers 24 for selectively illuminating the matrix addressed Liquid Crystal Display.

The multi-layer flex connector consist of a top insulating layer of polyimide of the type such as is available from DuPont Company under its trade name Kapton; A multiple copper track layer; a middle Kapton layer; a copper shield layer and a bottom Kapton layer with all of the layers being held together by epoxy, acrylic or other adhesive layers.

To connect the individual copper tracks layers at one end of the multi-flex connector to the connector pads on the Liquid Crystal Display, the bottom and middle Kapton layers and the copper shield layers are etched away to expose the multiple copper tracks. As will be described in detail in connection with FIG. 3, the exposed copper tracks on the flex assembly are soldered to the individual connector pads on the display thereby connecting the driver electronics secured in the leadless chip carrier to the flat panel connector pads. The epoxy adhesive layers not only hold the individual copper and Kapton layers together but also acts as laterally compliant layers so that any stresses due to differences in temperature coefficients of expansion between the flex layers and the leadless ceramic chip carrier are partially accommodated.

Multilayer flex connectors in a variety of sizes, a variety of conductor patterns etc. are commercially available from many sources. One such source is the Tech Etch Company of Plymouth, MA.

The sectional view of FIG. 3 illustrates the manner in which the copper tracks of the flex connector are secured to the connector pads on the Liquid Crystal Display. Thus, in FIG. 3 address line connector pads 41 are deposited on the surface. of the Liquid Crystal substrate 40. Pads 41 are typically a molybdenum titanium alloy.

In order to facilitate soldering of the connector pad, a metallic three layer connector structure is deposited over pad 41. First, a chromium layer 42 is deposited directly over the connector pad and contacts the surface of the glass substrate; chromium being a metal which readily adheres to glass. A layer of porous nickel 43 is deposited over the chromium layer and a silver layer 44 which is readily wetable by tin solder is deposited over the nickel. That is, the silver layer is readily wetable, by the solder pad 45 which is deposited on the exposed copper track. The flex connector shown generally at 46 consists of three insulating Kapton layers 47, 48 and 49 separated by adhesive and the copper track layer 50 and copper shield layer 51. The bottom and middle Kapton layers 48 and 49 and copper shield layer 51 are set back to align solder pad 45 with multi-layer connector pad structures 41–44.

The Kapton layers may be removed using any suitable polyimide etchant/solvent with a caustic etchant being preferred. Copper shield layer 51 may be removed using an $FeCl_3$ or dilute HCl solution.

The flex layer is placed over the connector pad structure 41–44 with solder pad 45, which may be either a solder paste or a solder ribbon, contacting the connector pad. The solder is heated by infrared radiation or by a laser beam causing the solder to melt readily wetting the silver layer 44 on top of the connector pad. Upon cooling a firm solder joint is formed between the connector pad and copper track 50.

FIG. 4 shows a plan view of the underside of a ceramic leadless chip carrier 51 and illustrates the manner in which the chip carrier is connected to the conductive copper tracks of the flex connector. Thus the underside of a chip carrier 51, shown in FIG. 4, has a plurality of conductive pads 52 distributed around its periphery. A flex connector 53 is shown with the bottom Kapton layer 54, copper shield layer 55 and middle Kapton layer 56 broken away to expose the multiple copper tracks 57 which are individually connected to conductive pads 52 on the leadless chip carrier. The individual copper tracks 57 are soldered to conductive pads 52 by means of any suitable solder with a tin/lead solder being preferred.

An expansion joint 58 is etched in the upper Kapton layer and is located between copper conductors 57. The expansion joints in the form of the etched window 58 allows for movement of the solder pad thereby minimizing or eliminating the stress on the solder joint due to differential temperature expansion coefficients of the Kapton, the copper tracks and the leadless chip carrier. Though a single etched expansion joint 58 is shown in FIG. 4, it will be obvious that more than one such expansion joint may be provided between the tracks to effectuate the desired result. Also, the plan view of the underside of the leadless chip carrier for simplicity of illustration shows a relatively small number of contact elements on each side. Actually commercially available chip carriers have large numbers of contact pads. The Contact pads extend through the body of the chip carriers and, as is well known, contact individual leads in the chip carriers which leads are to the output leads of the chips mounted in the chip carrier.

Figure 5:
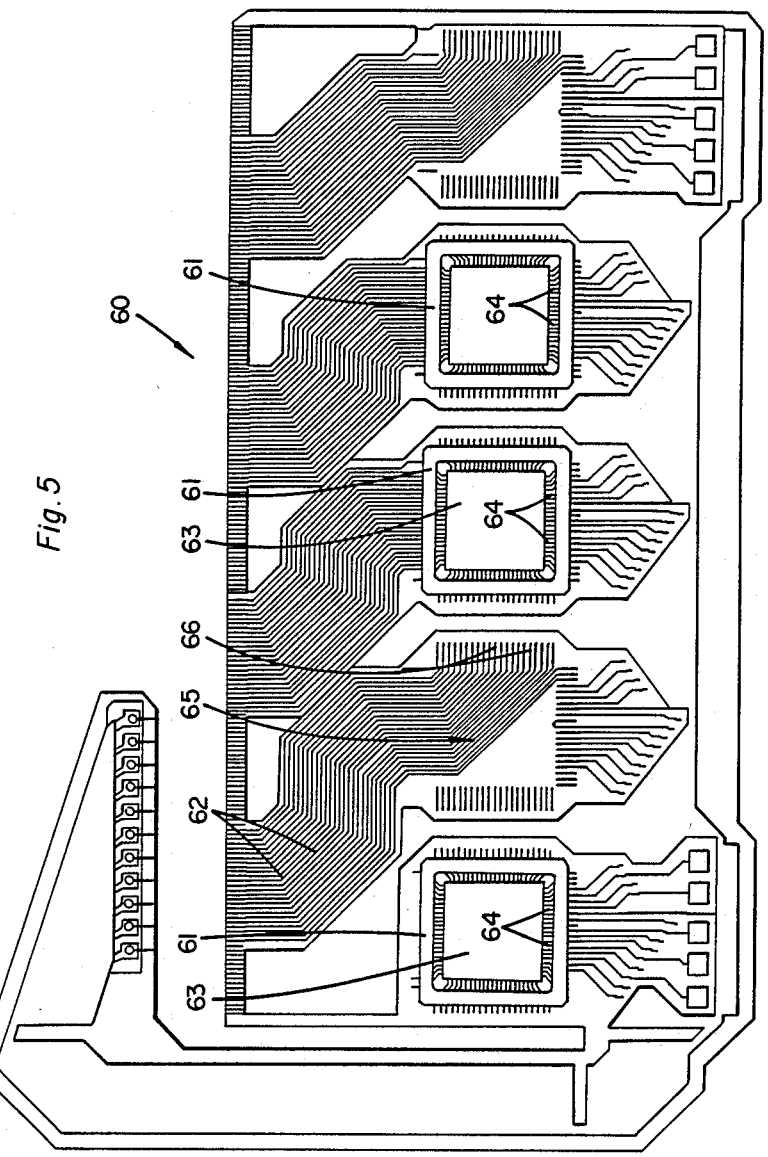
FIG. 5 is a plan view showing a plurality of chip carriers on the flex connector as well as a portion of the flex connector prepared for mounting of a carrier.

FIG. 5 is a plan view showing a plurality of chip carriers mounted on a flexible connector and is essentially a plan view of the flex assembly prior to connection of the conductive tracks to the Liquid Crystal Display. The multilayer flex connector is shown generally at 60 and has a plurality of chip carrier 61 secured thereto. The individual conductive tracks 62 of flex connector 60 are soldered to the conductive tabs, not shown, on the side and bottom of the carriers. The chip carriers are shown without the caps which hermetically seal the chip carrier thus exposing their interior chambers 63 in which the driver or other electronic circuit chips are mounted. A plurality of connector leads 64 are deposited on the surface of chambers 63. The inner ends of each conductor lead can be connected to the output leads of the circuit chips, mounted in the chamber. The other ends of these connector leads extend through the body of the chip carrier and contact the conductive tabs on the sides and bottom of the chip carrier.

Small deformation of the flexible connector under the chip carrier provides strain relief between solder pads on opposing sides and across corners.

Also shown in FIG. 5 is a portion of the flex connector which has been prepared for mounting of a chip carrier. The top Kapton layer of flex connector has been etched away to expose an area 65 and a plurality of conductive tracks. The end of each track in exposed area 65 has a solder pad 66, preferably of a tin solder alloy deposited thereon. The solder pads contact the conductive pads on the bottom of the chip carrier when a chip carrier is mounted in area 65. The solder pads are then heated to produce a solder joint between solder pads 66 and the conductive pads on the chip carrier.

It will now be apparent that the instant invention provides highly space efficient, compact, interconnection and packaging system for a Flat Panel Liquid Crystal Display utilizing a flexible multilayer connector which supports the driver electronic with the flex connector in which the flex is bent perpendicular to the display element thereby allowing efficient use of the available space around the display. Because the flex is positioned perpendicular to the display surface a minimum frontal area and minimum border is achieved for the display maximizes the display area minimizing the overall size.

The instant invention has been described with respect to preferred embodiments thereof, the invention is by no means limited thereto since many modifications of the instrumentalities employed and the structures utilized may be made and still fall within the scope of the invention. It is intended by the appended claims to cover all such modifications that fall within the spirit and scope of the invention.

What is claimed as new and desires to be secured by Letters Patent of the United States is:

1. A Liquid Crystal Display packaging arrangement comprising;
    (a) A flat panel Liquid Crystal Display element having a plurality of Liquid Crystal cells disposed in an X-Y matrix, connector pads for said matrix extending to the edge of said display element,
    (b) A multi-layer, flexible connector containing at least one layer having a plurality of conductive tracks and at least two (2) flexible insulating layers on either side of said track layer,
    (c) At least one chip carrier supporting an electronic chip for supplying signals to said display mounted on said flexible connector,
    (d) Means for connecting the circuit chip in said chip carrier to one or more of said conductive tracks,
    (e) Means for connecting the flexible connector to at least one edge of said display; the conductive tracks, in said connector being individually connected to the matrix connector pads at the edge of said display,
    (f) Said flexible connector being sent out of the plane of said display beyond the point of connection to said connector pads whereby the space occupied by said display and the connector is minimized.

2. The Liquid Crystal arrangement according to claim 1 wherein flexible, chip carrying connectors are connected to each edge of the display element.

3. The Liquid Crystal arrangement according to claim 1 wherein the flexible connector is bent substantially at right angles to the plane of the display element.

4. The Liquid Crystal arrangement according to claim 2 wherein all of the flexible chip carrying connectors are bent substantially at right angles to the plane of the display element.

5. The Liquid Crystal arrangement according to claim 1 in which the chip carrier is a leadless carrier having connector pads on the outer surfaces; said flexible connector having a portion of the insulating layer removed to expose the conductive tracks and means for connecting the conductive tracks to said pads on the chip carrier.

6. The Liquid Crystal arrangement according to claim 1 including leadless chip carriers.

* * * * *

UNITED STATES PATENT AND TRADEMARK OFFICE
CERTIFICATE OF CORRECTION

PATENT NO. : 4,836,651
DATED : June 6, 1989
INVENTOR(S) : Richard A. Anderson

It is certified that error appears in the above-identified patent and that said Letters Patent is hereby corrected as shown below:

Column 6,
Line 25, please delete "sent" and insert therefor -- bent --.

Signed and Sealed this

Eighteenth Day of October, 2005

JON W. DUDAS
*Director of the United States Patent and Trademark Office*